United States Patent [19]
Fathi et al.

[11] Patent Number: 5,738,915
[45] Date of Patent: Apr. 14, 1998

[54] CURING POLYMER LAYERS ON SEMICONDUCTOR SUBSTRATES USING VARIABLE FREQUENCY MICROWAVE ENERGY

[75] Inventors: Zakaryae Fathi, Cary; Denise A. Tucker, Raleigh; Richard S. Garard, Chapel Hill; Jianghua Wei, Raleigh, all of N.C.

[73] Assignee: Lambda Technologies, Inc., Morrisville, N.C.

[21] Appl. No.: 716,043

[22] Filed: Sep. 19, 1996

[51] Int. Cl.⁶ ............................................. C08F 2/46
[52] U.S. Cl. .................. 427/487; 427/8; 427/294; 427/385.5; 427/444; 427/492; 427/508; 427/553; 427/558; 427/595; 437/235
[58] Field of Search ..................... 427/385.5, 58, 427/444, 492, 508, 553, 558, 595, 8, 294; 437/235

[56] References Cited

U.S. PATENT DOCUMENTS

| | | | |
|---|---|---|---|
| 4,777,336 | 10/1988 | Asmussen | 219/10.55 M |
| 5,241,040 | 8/1993 | Cuomo et al. | 528/353 |
| 5,317,081 | 5/1994 | Gelorme et al. | 528/353 |
| 5,321,222 | 6/1994 | Bible et al. | 219/745 |

*Primary Examiner*—Bernard Pianalto
*Attorney, Agent, or Firm*—Myers Bigel Sibley & Sajovec, L.L.P.

[57] ABSTRACT

Rapid curing of polymer layers on semiconductor substrates is facilitated using variable frequency microwave energy. A semiconductor substrate having a polymer layer thereon is placed in a microwave furnace cavity, and then swept with a range of microwave frequencies. The range of frequencies includes a central frequency selected to rapidly heat the polymer layer. The range of frequencies is selected to generate a plurality of modes within the cavity. The sweep rate is selected so as to avoid damage to the semiconductor substrate and/or any components thereon. The microwave power may be adjusted during frequency sweeping to control the temperature of the polymer layer and the semiconductor substrate. Effluent produced during the curing of the polymer layer may be removed from the furnace cavity. The extent of cure of the polymer layer may be determined by detecting power reflection for each microwave frequency within the range to provide power reflection data, and then comparing the power reflection data with a predetermined set of power reflection data.

7 Claims, 4 Drawing Sheets

1

CURING POLYMER LAYERS ON SEMICONDUCTOR SUBSTRATES USING VARIABLE FREQUENCY MICROWAVE ENERGY

FIELD OF THE INVENTION

The present invention relates generally to the curing of polymers, and more particularly to the curing of polymers using microwave energy.

BACKGROUND OF THE INVENTION

In the fabrication of semiconductor wafers, layers of various conductive and nonconductive polymeric materials are typically applied to a surface of the wafer during various stages of production. Polyimide is a polymer material often used in the production of semiconductor substrates such as silicon wafers. Polyimide is a desirable insulating material for semiconductor wafers because of its outstanding physical properties. Unfortunately, polyimide typically requires a long time to cure when conventional heating techniques are used. A cure cycle of several hours is typical and this often becomes the pacing step in semiconductor fabrication. In addition, there are other problems involved with curing polyimide resin with conventional heat. For example, when polyimide resin is cured in a conventional furnace, the outer surface of the resin typically cures faster than the center portions. This can cause various physical defects, such as the formation of voids, and can result in inferior mechanical properties such as reduced modulus, enhanced swelling, solvent uptake, and coefficient of thermal expansion.

Microwave energy is being investigated in a variety of manufacturing operations, including those involving the curing of polymeric materials. Microwave processing of polymeric materials is believed to be advantageous for a number of reasons. The application of microwave energy decreases the time required to cure some polymers as compared with conventional heating methods. This is because the volumetric deposition of microwave energy is more efficient than conduction from the surface resulting from conventional heating techniques. See, for example, *Polymer Curing In A Variable Frequency Microwave Oven*, R. J. Lauf et al., Oak Ridge National Laboratory. See also, U.S. Pat. No. 5,296,271 to Swirbel et al., which proposes a method of curing photoreactive polymers by exposing them to microwave energy. Additionally, microwave processing is more economically attractive than conventional heating techniques due to the shorter processing time required to cure the resin.

The application of single frequency microwave energy within a single mode resonant microwave furnace cavity to cure polyimide on a semiconductor wafer is described in U.S. Pat. No. 5,317,081 to Gelorme et al., and U.S. Pat. No. 5,241,040 to Cuomo et al. In each of these patents, the rate of cure is controlled by varying microwave power and by changing the physical characteristics of the cavity (referred to as "tuning"). As the polyimide resin cures, it causes the resonance of the cavity to change, thereby requiring compensation via tuning to maintain the cavity at maximum resonance (i.e., where reflected power is at a minimum). Tuning is accomplished by moving a plate within the microwave furnace up or down and moving a coupling probe in and out of the cavity, accordingly.

Unfortunately, the maximum size of a semiconductor wafer and/or the number of wafers that can be uniformly processed with single frequency microwave energy in a single-mode or multi-mode cavity are limited. This is because the size and number of modes (also referred to as "hot spots") within a cavity are limited when single frequency microwave energy is used. If the area of the semiconductor wafer to be processed is larger than a mode, it becomes extremely difficult to obtain uniform and repeatable processing at a single frequency. Therefore, large scale microwave processing can be difficult using a fixed frequency of microwave irradiation in either a single mode or multi-mode cavity. In fact, the above patents acknowledge the difficulty of providing uniform curing of sizable electronic components in these types of cavities.

SUMMARY OF THE INVENTION

It is therefore an object of the present invention to uniformly cure a polymer layer on a semiconductor substrate, such as a wafer, wherein the substrate is larger than an individual mode in a single mode or multi-mode microwave cavity.

It is another object of the present invention to facilitate simultaneous processing of polymer layers on multiple semiconductor substrates with microwave energy.

These and other objects are accomplished, according to the present invention, by methods of curing a polymer layer on a semiconductor substrate. Often, a semiconductor substrate is in the form of a wafer formed from such materials as silicon, germanium, gallium arsenide, diamond, and the like. Semiconductor substrates typically have one or more layers of polymer resin, such as polyimide, thereon. The present invention facilitates rapid curing of polymer layers on semiconductor substrates having various configurations. For example, multiple substrates, each having one or more polymer layers thereon, can be stacked together and processed at the same time via the present invention. In addition, a multi-chip module including multiple substrates sandwiched together can have a top layer of polymer cured via the present invention.

A polymer layer is cured, according to the present invention, by placing a semiconductor substrate having a polymer layer thereon in a microwave furnace cavity, and then sweeping the semiconductor substrate with at least one range of microwave frequencies. A range of frequencies includes a central frequency selected to rapidly heat the polymer layer. A range is selected to generate a plurality of modes within the cavity. Sweeping is performed at a rate selected to avoid damage to the polymer layer and to the substrate and any electronic components attached thereto. The microwave power may be adjusted during frequency sweeping to control the temperature of the polymer layer and the semiconductor substrate.

In addition, effluent, such as gas, vapor, and the like, may be removed during frequency sweeping. Effluent removal may occur by creating either a slight positive pressure within the cavity or by creating a slight vacuum within the cavity. For example, the microwave furnace cavity may be purged with an inert gas, such as nitrogen, argon, neon, helium, krypton, xenon, and the like. The extent of cure of a polymer layer may be determined by detecting power reflection for each microwave frequency within a range to provide power reflection data, and then comparing the power reflection data with a predetermined set of power reflection data.

The present invention is advantageous because sweeping a semiconductor substrate with a range of microwave frequencies facilitates curing with uniformity in three dimensions. Consequently, the present invention is scaleable to production sizes wherein large substrates (i.e., wafers of twelve inches (12") (30.3 cm) in diameter and beyond) can be processed, not only in an array configuration, but also in a three dimensional stacked array configuration.

The rate of cure is controlled, according to the present invention, by controlling microwave power, microwave frequency, and sweep rate. Sweeping a semiconductor substrate, such as a wafer, is a much better method of controlling the rate of cure than is tuning of the cavity because sweeping sustains uniform energy distribution without causing hot spots within the microwave furnace cavity.

DETAILED DESCRIPTION OF PREFERRED EMBODIMENTS

The present invention now is described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Figure 1:
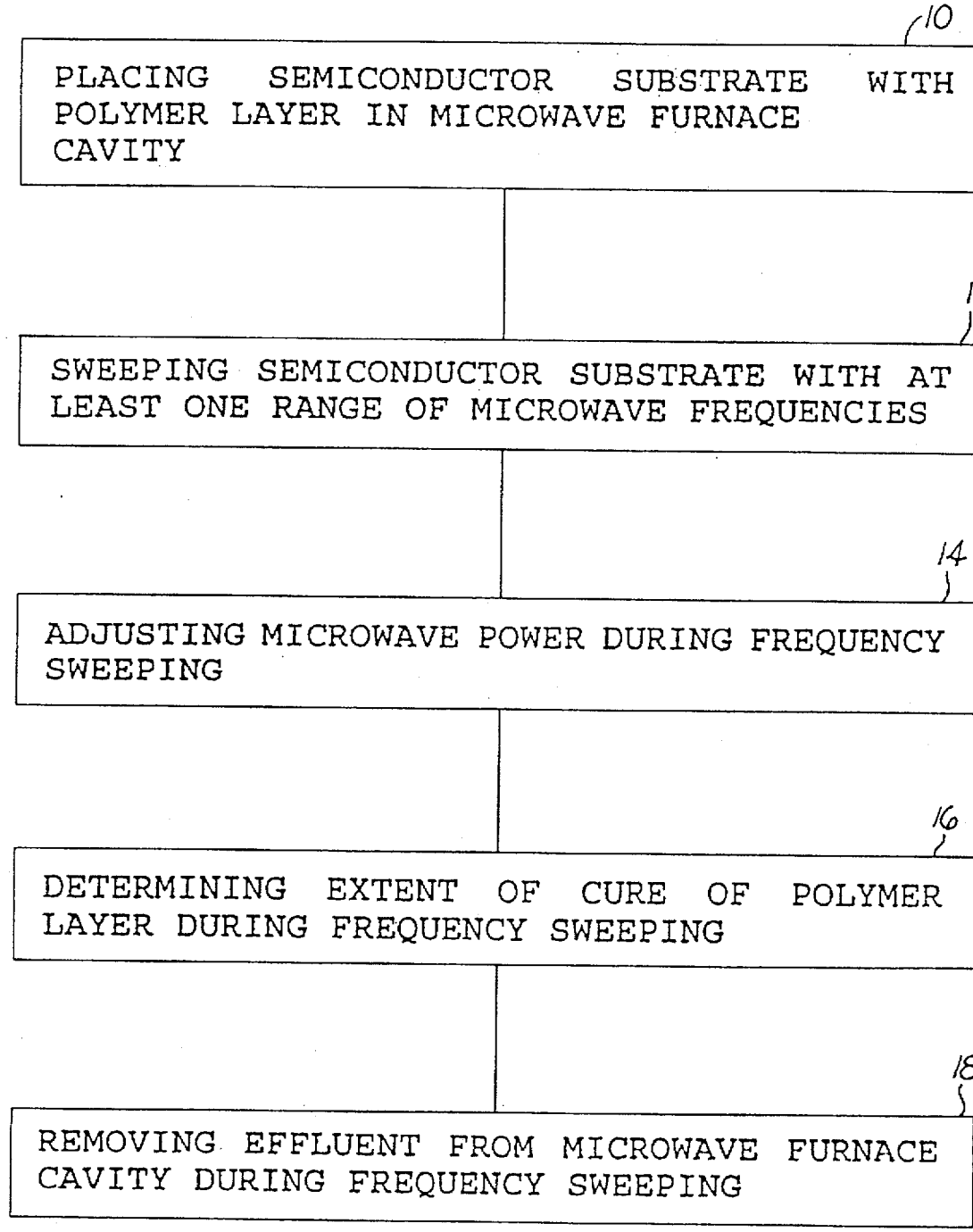
FIG. 1 is a flow diagram schematically illustrating method steps for curing a polymer layer on a semiconductor substrate, according to the present invention.

As is known to those skilled in the art, semiconductor substrates, such as semiconductor wafers, are typically made from various materials such as silicon, germanium, gallium arsenide, diamond, and the like. Semiconductor substrates utilize various polymer layers in the formation of circuitry thereon, as is known to those having skill in the art. Referring now to FIG. 1, a method for curing a polymer layer on a semiconductor substrate, according to the present invention, is schematically illustrated. The illustrated method includes placing 10 a semiconductor substrate having a polymer layer thereon in a microwave furnace cavity, sweeping 12 the semiconductor substrate with a range of microwave frequencies, and adjusting microwave power 14 to control the temperature of the polymer layer and the semiconductor substrate. The range of frequencies preferably has a central frequency selected to rapidly heat the polymer layer. The range of frequencies is also selected to generate a plurality of modes within the cavity. Sweeping is performed at a rate selected to prevent damage to the polymer layer and/or to electronic components attached to the semiconductor substrate caused by arcing and/or localized heating.

The step of adjusting microwave power 14 may be performed simultaneously with the step of sweeping 12 the semiconductor substrate with a range of microwave frequencies. The purpose of the step of adjusting microwave power 14 is to control the temperature of the semiconductor substrate and polymer layer thereon. By controlling the temperature, the desired thermal profile of the semiconductor substrate and polymer layer during curing can be maintained.

In addition, the present invention may include the step of determining 16 the extent of cure of the polymer layer by detecting power reflection for the polymer layer for each microwave frequency within a range to provide power reflection data. This power reflection data can then be compared with a predetermined set of power reflection data. Preferably, the step of determining the extent of cure 16 occurs simultaneously with the steps of frequency sweeping 12 and adjusting 14 microwave power.

The present invention may also include the step of removing effluent 18 from the microwave furnace cavity during the steps of sweeping 12 and adjusting 14 microwave power. Typically volatile effluent, including gases, vapors, and the like, are produced during the curing of polymers and it is desirable to remove these because they can condense on the surface of the polymer layer and cause various irregularities therein which can affect the physical properties of the polymer layer. The step of removing 18 effluent from a microwave furnace cavity may include purging the cavity with an inert gas to create a slight positive pressure therein. Exemplary gases used in the semiconductor industry and which can be used for purging include nitrogen, argon, neon, helium, krypton, xenon, and the like. A preferable inert gas for purging is nitrogen. However, other gases may be utilized, as would be known to those having skill in the art. Purging also facilitates the removal of solvents from the semiconductor substrate and ensures that oxidation of reactants does not occur. The step of removing 18 effluent from the microwave furnace cavity may also include establishing a slight vacuum within the cavity during the steps of sweeping 12 and adjusting 14 microwave power.

Figure 2:
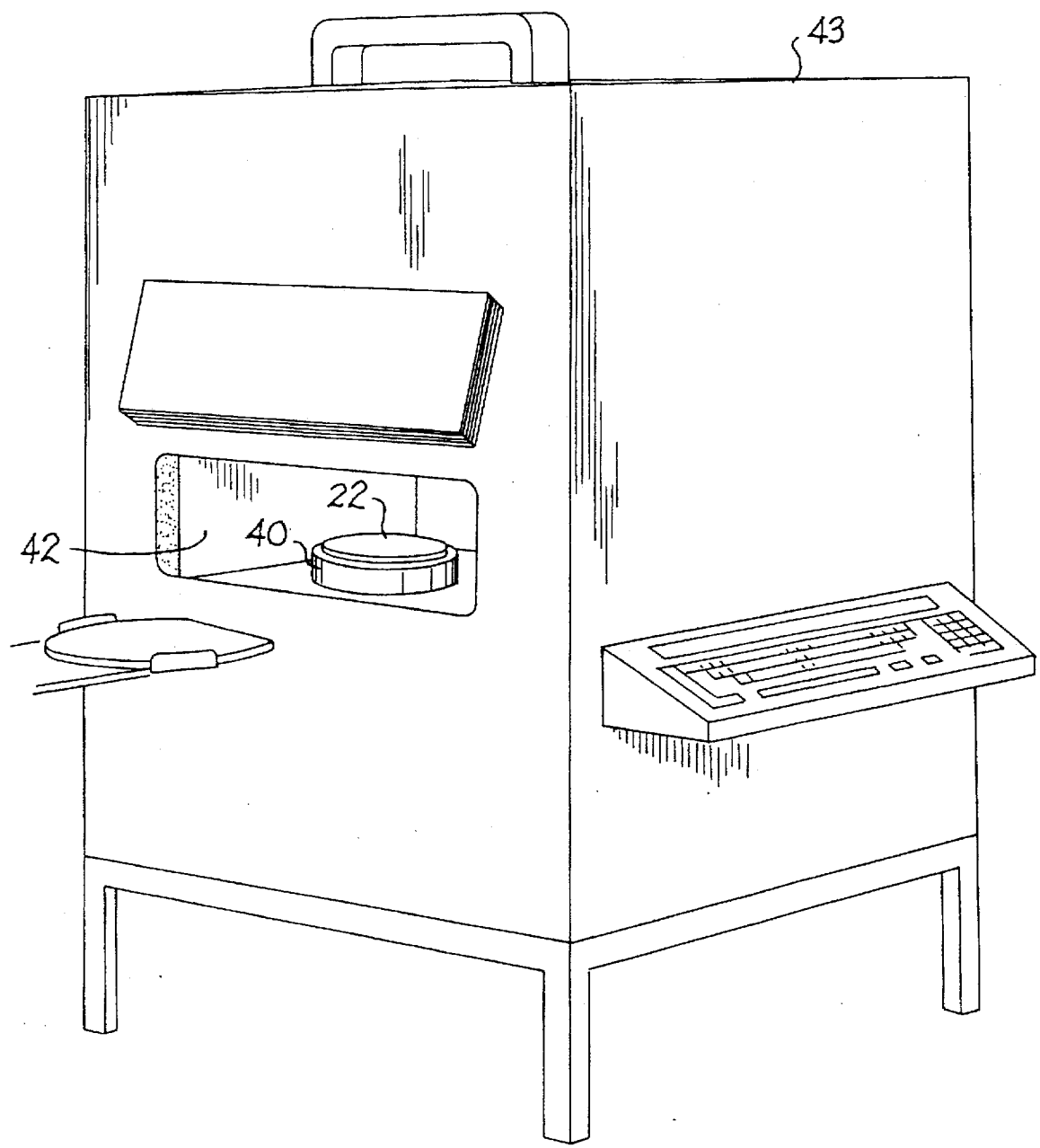
FIG. 2 illustrates a semiconductor substrate placed within a microwave furnace cavity.

Typically, a semiconductor substrate 22 having an uncured polymer layer thereon is placed on a holder 40, and the holder and semiconductor substrate are placed within a cavity 42 of a microwave furnace 43 as illustrated in FIG. 2. The primary purpose of the holder 40 is to hold the semiconductor substrate during processing. However, the holder 40 may be configured to enclose the semiconductor substrate and to facilitate maintaining a uniform temperature throughout the substrate and its polymer layer during microwave processing. Heat tends to radiate from the edges of a semiconductor substrate, often resulting in non-uniform curing of the polymer layer thereon, when measures are not taken to maintain a uniform temperature around the substrate. Preferably, a holder for use in accordance with the present invention is made from quartz. Quartz is an especially preferred material because it is microwave transparent, it is a good insulator, it can withstand high temperatures, and it does not contaminate most semiconductor substrates. However, other suitable holder materials, including alumina, boron nitride and the like, may be used.

Other ways of maintaining uniform temperature of a semiconductor substrate during microwave processing include controlling the temperature within the microwave furnace cavity. As would be understood by those having skill in the art, this can be accomplished in a variety of ways. For example, an inert gas used to create a positive pressure within the cavity during the step of effluent removal 18, can be heated and regulated to maintain the appropriate temperature within the cavity.

The present invention can be used to cure polymer layers on semiconductor substrates of all sizes and configurations, and is not limited to the processing of semiconductor wafers.

For example, a multi-chip module including multiple substrates sandwiched together can have a top layer of polymer cured via the present invention. Furthermore, the size of semiconductor substrates, including semiconductor wafers, that can be processed with the present invention is virtually unlimited.

An exemplary microwave furnace for carrying out the present invention is described in U.S. Pat. No. 5,321,222, to Bible et al., the disclosure of which is incorporated herein by reference in its entirety. The step of sweeping 12 a semiconductor substrate with a range of microwave frequencies and the step of adjusting microwave power 14 is preferably performed within a multi-mode microwave furnace cavity of the type described in the Bible et al. patent. In general, a microwave furnace for carrying out the present invention typically includes a microwave signal generator or microwave voltage-controlled oscillator for generating a low-power microwave signal for input to the microwave furnace. A first amplifier may be provided to amplify the magnitude of the signal output from the microwave signal generator or the microwave voltage-controlled oscillator. A second amplifier is provided for processing the signal output by the first amplifier. A power supply is provided for operation of the second amplifier. A directional coupler is provided for detecting the direction of a signal and further directing the signal depending on the detected direction. Preferably a high-power broadband amplifier, such as, but not limited to, a traveling wave tube (TWT), tunable magnetron, tunable klystron, tunable twystron, and a tunable gyrotron, is used to sweep a range of frequencies of up to an octave in bandwidth and spanning the 300 MHz to 300 GHz frequency range. A range of microwave frequencies for curing a polymer layer in accordance with the present invention may include virtually any number of frequencies, and is not limited in size.

Use of variable frequency processing, as disclosed herein, enhances uniform processing from one semiconductor substrate to the next because placement of each substrate within the furnace cavity is not critical. By contrast, with single frequency microwave processing, each substrate must be oriented in precisely the same way within the furnace cavity to achieve identical and repeatable processing time and quality. In addition, uniform processing of multiple large semiconductor substrates, such as semiconductor wafers with diameters of six inches (6") (15 cm) and beyond, both side-by-side and stacked, is difficult to achieve in both single mode and multi-mode furnaces using single frequency microwave irradiation.

A potential advantage of using variable frequency microwave processing, as disclosed herein, is a reduction of the effects of thermal stresses. By selecting frequencies that cure a particular polymer without causing excessive heating of the substrate, damage from thermal stresses may be avoided. Furthermore, because the present invention achieves shorter cure times than conventional curing methods, adjacent materials having different coefficients of thermal expansion, do not have enough time to expand or contract and, thereby, cause excessive thermal stresses at their interface.

The practical range of frequencies within the electromagnetic spectrum from which microwave frequencies may be chosen is about 0.90 GHz to 40 GHz. Every substrate and polymer layer thereon exposed to microwave energy typically has at least one range or window of microwave frequencies that is optimum for curing the polymer layer without allowing damage to occur to the substrate, the polymer layer, or any components attached to the substrate, either from which a given material absorbs microwave energy, and is thereby heated, is determined by its dielectric properties, the applied microwave frequency, and the electric field distribution within the material.

Above or below a particular optimum window of frequencies, damage may occur or curing may not occur optimally. A window may vary depending on semiconductor substrate configuration, geometry, and material composition. A window may also vary depending on the nature and configuration of the polymer layer or layers. The selection of a window for a particular semiconductor substrate and polymer layer is typically obtained either empirically through trial and error, or theoretically using power reflection curves and the like.

Within a window of frequencies selected for a particular semiconductor substrate and polymer layer, it is generally desirable to select the frequencies that result in the shortest time to cure the polymer layer. Preferably, a semiconductor substrate is processed with a subset of frequencies from the upper end of each window. More modes can be excited with higher frequencies than with lower frequencies, thereby resulting in shorter cure times. Additionally, better uniformity in curing is typically achieved by using the upper-end frequencies within a window. However, any subset of frequencies within a window of frequencies may be used.

Many semiconductor substrates have multiple windows of frequencies within which polymer layers will cure without causing damage to the substrate or polymer layer. For example, a semiconductor substrate may be processed without damage between 3.50 GHz and 6.0 GHz, and may also be processed without damage between 7.0 GHz and 10.0 GHz. The availability of additional windows provides additional flexibility for achieving rapid, uniform, yet damage-free curing. Often times arcing or localized heating. The term "window", as defined above, refers to a range of microwave frequencies bounded on one end by a specific frequency and bounded on the opposite end by a different specific frequency.

Damage from arcing can occur when microwave energy is applied to a semiconductor substrate containing conductive materials including electronic components attached thereto. Arcing typically occurs only within certain ranges or windows of microwave frequencies. Other windows of microwave frequencies typically exist wherein arcing does not occur. Similarly, there are windows of microwave frequencies wherein localized heating of a semiconductor substrate will occur, and there are windows of microwave frequencies wherein such localized heating will not occur. By selecting one or more windows of damage-free frequencies, polymer layers on semiconductor substrates can be cured rapidly using microwave energy without concern for damage from localized heating or arcing, even in the presence of conductive materials and electronic components. Furthermore, the sweeping rate in a particular window of frequencies can be selected to avoid damage to the semiconductor substrate and/or components attached thereto.

Each window preferably has a central frequency that is selected to rapidly heat and cure a particular polymer. This means that the selected frequency is the frequency at which the polymer layer is at or near maximum absorption of microwave energy. Microwave energy heats by coupling at the molecular level with the material to which it is applied producing volumetric heating within the material. When microwave energy is optimally tuned for heating the material at a central frequency within a window of frequencies, the heating is very efficient as compared with conventional convection heat ovens. The extent to semiconductor substrates are stacked or have various polymer layers thereon which may actually shrink or eliminate a particular window of frequencies available for processing. The availability of alternative windows permits a semiconductor substrate to be processed with microwave energy without having to resort to other curing methods. The availability of multiple windows of frequencies also permits "hopping" between two or more windows during microwave processing to obtain optimum curing. For example, optimum curing of a particular semiconductor substrate having a polymer layer thereon may be obtained by sweeping with microwave frequencies between 3.50 GHz and 6.0 GHz for a period of time and then sweeping, for a period of time, between 7.0 GHz and 10.0 GHz.

Preferably, the step of frequency sweeping 12 is performed using frequencies from within at least one window of frequencies, as described above. Frequency sweeping 12 causes uniformity of heating because many cavity modes can be excited. Frequency sweeping 12 may be accomplished by launching the different frequencies within a window either simultaneously, or sequentially. For example, assume the window of frequencies for a particular semiconductor substrate is 2.60 GHz to 7.0 GHz. Frequency sweeping would involve continuously and/or selectively launching frequencies within this range in any desirable increments, such as 2.6001 GHz, 2.6002 GHz, 2.6003 GHz . . . 3.30 GHz, etc. Virtually any incremental launching pattern may be used without departing from the spirit and intent of the present invention.

The rate at which the different frequencies are launched is referred to as the sweep rate. This rate may be any value, including, but not limited to, milliseconds, and minutes. Preferably, the sweep rate is as rapid as practical for the particular polymer layer and semiconductor substrate being processed. In addition, the sweep rate is selected so that an optimum number of modes are generated within the furnace cavity. Sweep rate may also be selected based on the thickness of the polymer layer to be cured.

The uniformity in processing afforded by frequency sweeping provides flexibility in how a semiconductor substrate is oriented within the microwave furnace, and permits a plurality of substrates to be stacked during processing. Maintaining each semiconductor substrate in precisely the same orientation is not required to achieve uniform processing. Furthermore, the variable frequency sweeping method of curing polymer layers on semiconductor substrates, according to the present invention, can be applied in both single mode and multi-mode microwave cavities.

Preferably, the variable frequency microwave oven for curing polymer layers, according to the present invention, is under computer control. Under computer control, the microwave furnace is tuned to a particular frequency, preferably the optimum incident frequency for a particular size and type of semiconductor substrate, and then is programmed to sweep around this central frequency to generate a plurality of modes and rapidly move them around the cavity to provide a uniform energy distribution. In addition, the optimum coupling frequency may change during the processing of a semiconductor substrate. This is because the dielectric properties of polymers such as polyimide and/or substrate materials change during heating. Accordingly, it is preferred that the central frequency be adjustable, preferably under computer control, to compensate automatically for such changes.

The step of determining 16 the extent of cure of a polymer layer on a semiconductor substrate can be determined in situ by measuring the shift in dielectric properties of the polymer layer, as described in commonly assigned, copending U.S. Ser. No. 08/531,045 filed Sep. 20, 1995, the disclosure of which is incorporated herein by reference in its entirety. When a semiconductor substrate is irradiated with microwave energy within a microwave furnace cavity, the interaction between the microwave energy and the substrate is influenced by the applied microwave frequency, cavity dimensions, substrate configuration, substrate material properties including polymer layers thereon, and the location of the substrate within the cavity. This interaction can be monitored using the percentage of the power reflected back to the microwave launcher. This percentage is calculated by dividing the reflected power ($P_r$) by the input power ($P_i$). When a semiconductor substrate is irradiated with a range or window of frequencies from a variable frequency microwave source, for example 1 to 20 GHz, a power reflection curve as a function of incident frequencies can be obtained. The shape of this curve comprises intrinsic peaks that are related to the dielectric properties, shape, and configuration of the substrate material and polymer layer.

For every semiconductor substrate and polymer layer thereon, in a given position within a microwave cavity, there is a unique curve, or "signature curve", over the launched microwave frequency range. Any variation in this signature curve, as indicated by frequency shift and/or magnitude change of the intrinsic peaks, is solely a function of changing material properties or conditions. For example, if the dimensions of a microwave cavity are held constant, and two substrates, each comprised of the same material and polymer layer and having substantially identical shapes and sizes, are positioned within the cavity in substantially the same way, the signature curves generated for each substrate, upon being irradiated with the substantially same range of microwave frequencies, will be substantially identical. Any variation or shifts between the two signature curves is an indication that the substrates do not comprise material or layers thereon in the same condition or state. The magnitude of the shift depends on the shape, dielectric properties, and location of the semiconductor substrate and polymer layer within the cavity.

Consequently, the stage of cure of a polymer layer is determinable from signature curve shifts. As would be understood by those having skill in the art, it is not necessary to produce signature curves in printed form or on a computer screen. Intrinsic peak shifts can be calculated and product characteristics determined independent of a tangible signature curve. The power reflection data necessary to produce a signature curve may simply be analyzed within a processor, such as a computer.

EXAMPLE

Figure 3A:
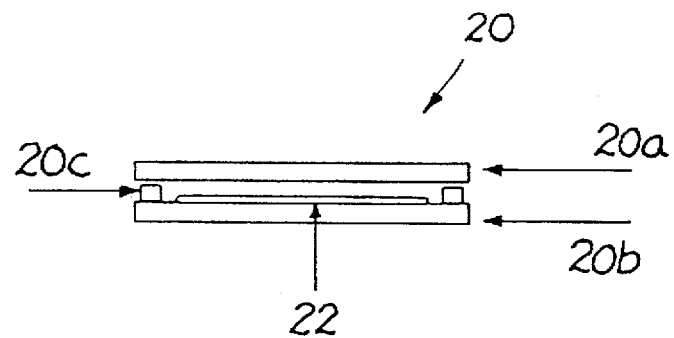
FIGS. 3a, 3b illustrate the holder used for retaining a semiconductor wafer having a polymer layer thereon during microwave processing as described in the Example.
Figure 3B:
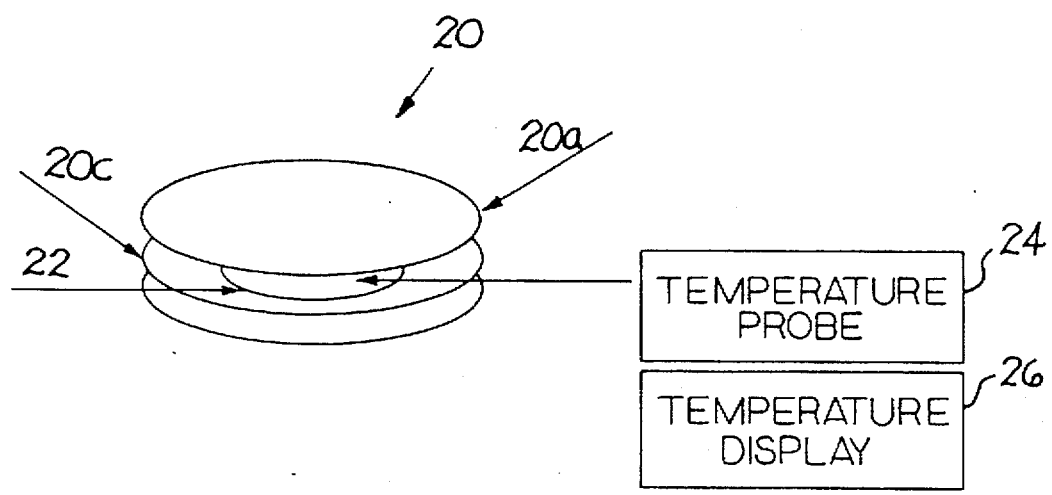

An eight inch (8") (20.3 cm) silicon wafer having a layer of polyimide with a thickness of between about one and seven-tenths microns and about fourteen microns (1.7μ–14μ) thereon was placed within a quartz holder of the type illustrated in FIGS. 3a and 3b. The holder 20 included generally circular upper and lower plates 20a, 20b with a central ring 20c sandwiched therebetween. The central ring 20c had an outside diameter generally equivalent to the diameter of each plate 20a,20b. The central ring 20c was configured to receive the wafer 22 therein, as illustrated. A temperature probe 24 was connected to the backside of the wafer 22 to indicate relative temperature and so as not to interfere with the curing of the polyimide layer. Temperature was displayed during microwave processing via display 26.

The holder and wafer assembly was placed within a multi-mode microwave furnace of the type described above.

The furnace cavity was purged with nitrogen gas at a flow rate of about one-half liters per minute to about five liters per minute (0.5 liter/min—5.0 liter/min) to maintain a slight positive pressure within the cavity. The holder and wafer assembly were subjected to a window of microwave frequencies having a central frequency of about five and one-half (5.5) GHz and ranging between about five (5.0) GHz and about six (6.0) GHz. The sweep rate was about one-tenth of a second (0.1 seconds). The power was adjusted continuously between about zero (0) watts to about seven-hundred (700) watts in order to control the temperature profile.

Figure 4:
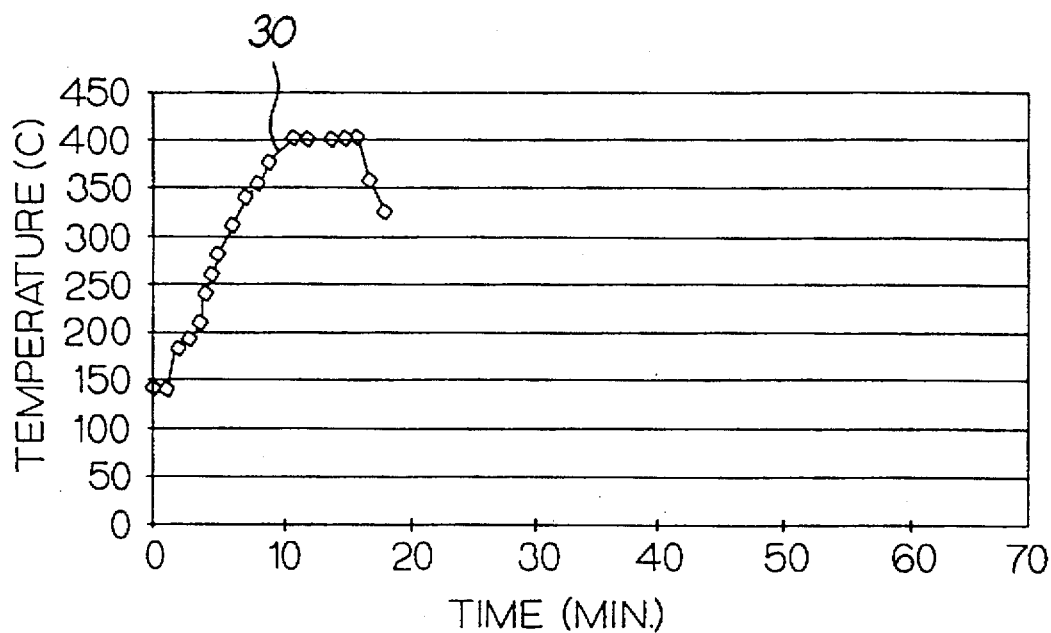
FIG. 4 is a graph illustrating the temperature profile of a semiconductor wafer processed with microwave energy, as described in the Example.
Figure 5:
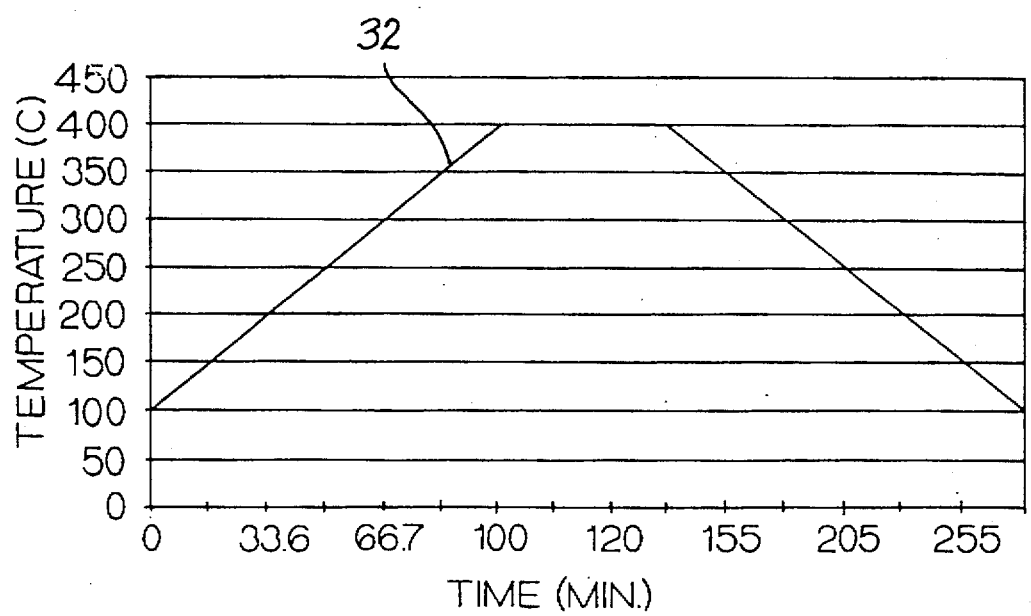
FIG. 5 is a graph illustrating the temperature profile of a semiconductor wafer processed with conventional heat, as described in the Example.

Results are illustrated in FIG. 4. Temperature, in degrees centigrade is plotted along the "Y" axis and time in minutes is plotted along the "X" axis. As shown by the temperature-versus-time profile 30, uniform curing of the polyimide layer was accomplished in less than twenty (20) minutes. By contrast, the results of curing a duplicate eight inch (8") (20.3 cm) silicon wafer having a layer of polyimide with the same thickness thereon in a conventional convection furnace are illustrated in FIG. 5 where temperature, in degrees centigrade, is plotted along the "Y" axis and time in minutes is plotted along the "X" axis. As shown by the temperature-versus-time profile 32, conventional curing with heat required in excess of five (5) hours.

The extent of cure and the material properties of the polyimide layer of each wafer were equivalent. However, as illustrated, achievement of the same degree of cure and the same material properties required a much longer time with conventional heat curing than with the use of variable frequency microwave energy in a multi-mode cavity in accordance with the present invention. Curing times using convection furnaces are difficult to reduce because thermal differences can cause poor mechanical properties and voids and other defects in the polymer layer.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of curing a polyimide layer on at least one semiconductor wafer, said method comprising the steps of:

(a) placing at least one semiconductor wafer having a polyimide layer thereon in a microwave furnace cavity;

(b) sweeping said at least one semiconductor wafer with at least one range of microwave frequencies, said at least one range having a central frequency selected to rapidly heat said polyimide layer, said at least one range selected to generate a plurality of modes within said cavity, said sweeping performed at a rate selected to avoid damage to said polyimide layer and/or components attached to said at least one semiconductor wafer;

(c) adjusting microwave power during said step (b) to control the temperature of said polyimide layer and said at least one semiconductor wafer;

(d) continuously determining, during said steps (b) and (c), an extent of cure of said polyimide layer by detecting power reflection for said polyimide layer for each microwave frequency within said at least one range to provide power reflection data, and comparing said power reflection data to a predetermined set of power reflection data; and (e) removing effluent produced during said steps (b) and (c) from said microwave furnace cavity.

2. A method according to claim 1 wherein removing effluent from said microwave furnace cavity comprises establishing a positive pressure within said furnace cavity by purging said microwave furnace cavity with an inert gas selected from the group consisting of nitrogen, argon, neon, helium, krypton, and xenon.

3. A method according to claim 1 wherein removing effluent from said microwave furnace cavity comprises establishing a positive pressure within said furnace cavity by purging said microwave furnace cavity with nitrogen.

4. A method according to claim 1 wherein removing effluent from said microwave furnace cavity comprises establishing a vacuum within said microwave furnace cavity.

5. A method according to claim 1 wherein said at least one semiconductor wafer is formed of material selected from the group consisting of silicon, germanium, gallium arsenide, and diamond.

6. A method according to claim 1 wherein said at least one semiconductor wafer comprises a plurality of semiconductor wafers.

7. A method according to claim 1 wherein said at least one range of microwave frequencies is a plurality of ranges of microwave frequencies.

* * * * *

UNITED STATES PATENT AND TRADEMARK OFFICE
CERTIFICATE OF CORRECTION

PATENT NO. : 5,738,915
DATED : April 14, 1998
INVENTOR(S) : Fathi, et al

Page 1 of 2

It is certified that error appears in the above-identified patent and that said Letters Patent is hereby corrected as shown below:

Column 5 and 6. Should be deleted and substitute therefor the attached.

Signed and Sealed this

First Day of September, 1998

BRUCE LEHMAN

*Attest:*

*Attesting Officer*  *Commissioner of Patents and Trademarks*

For example, a multi-chip module including multiple substrates sandwiched together can have a top layer of polymer cured via the present invention. Furthermore, the size of semiconductor substrates, including semiconductor wafers, that can be processed with the present invention is virtually unlimited.

An exemplary microwave furnace for carrying out the present invention is described in U.S. Pat. No. 5,321,222, to Bible et al., the disclosure of which is incorporated herein by reference in its entirety. The step of sweeping 12 a semiconductor substrate with a range of microwave frequencies and the step of adjusting microwave power 14 is preferably performed within a multi-mode microwave furnace cavity of the type described in the Bible et al. patent. In general, a microwave furnace for carrying out the present invention typically includes a microwave signal generator or microwave voltage-controlled oscillator for generating a low-power microwave signal for input to the microwave furnace. A first amplifier may be provided to amplify the magnitude of the signal output from the microwave signal generator or the microwave voltage-controlled oscillator. A second amplifier is provided for processing the signal output by the first amplifier. A power supply is provided for operation of the second amplifier. A directional coupler is provided for detecting the direction of a signal and further direction the signal depending on the detected direction. Preferably a high-power broadband amplifier, such as, but not limited to, a traveling wave tube (TWT), tunable magnetron, tunable klystron, tunable twystron, and a tunable gyrotron, is used to sweep a range of frequencies of up to an octave in bandwidth and spanning the 300 MHz to 300 GHz frequency range. A range of microwave frequencies for curing a polymer layer in accordance with the present invention may include virtually any number of frequencies, and is not limited in size.

Use of variable frequency processing, as disclosed herein, enhances uniform processing from one semiconductor substrate to the next because placement of each substrate within the furnace cavity is not critical. By contrast, with single frequency microwave processing, each substrate must be oriented in precisely the same way within the furnace cavity to achieve identical and repeatable processing time and quality. In addition, uniform processing of multiple large semiconductor substrates, such as semiconductor wafers with diameters of six inches (6") (15 cm) and beyond, both side-by-side and stacked, is difficult to achieve in both single mode and multi-mode furnaces using single frequency microwave irradiation.

A potential advantage of using variable frequency microwave processing, as disclosed herein, is a reduction of the effects of thermal stresses. By selecting frequencies that cure a particular polymer without causing excessive heating of the substrate, damage from thermal stresses may be avoided. Furthermore, because the present invention achieves shorter cure times than conventional curing methods, adjacent materials having different coefficients of thermal expansion, do not have enough time to expand or contract and, thereby, cause excessive thermal stresses at their interface.

The practical range of frequencies within the electromagnetic spectrum from which microwave frequencies may be chosen is about 0.90 GHz to 40 GHz. Every substrate and polymer layer thereon exposed to microwave energy typically has at least one range or window of microwave frequencies that is optimum for curing the polymer layer without allowing damage to occur to the substrate, the polymer layer, or any components attached to the substrate, either from arcing or localized heating. The term "window", as defined above, refers to a range of microwave frequencies bounded on one end by a specific frequency and bounded on the opposite end by a different specific frequency.

Damage from arcing can occur when microwave energy is applied to a semiconductor substrate containing conductive materials including electronic components attached thereto. Arcing typically occurs only within certain ranges or windows of microwave frequencies. Other windows of microwave frequencies typically exist wherein arcing does not occur. Similarly, there are windows of microwave frequencies wherein localized heating of a semiconductor substrate will occur, and there are windows of microwave frequencies wherein such localized heating will not occur. By selecting one or more windows of damage-free frequencies, polymer layers on semiconductor substrates can be cured rapidly using microwave energy without concern for damage from localized heating or arcing, even in the presence of conductive materials and electronic components. Furthermore, the sweeping rate in particular window of frequencies can be selected to avoid damage to the semiconductor substrate and/or components attached thereto.

Each window preferably has a central frequency that is selected to rapidly heat and cure a particular polymer. This means that the selected frequency is the frequency at which the polymer layer is at or near maximum absorption of microwave energy. Microwave energy heats by coupling at the molecular level with the material to which it is applied producing volumetric heating within the material. When microwave energy is optimally tuned for heating the material at a central frequency within a window of frequencies, the heating is very efficient as compared with conventional convection heat ovens. The extent to which a given material absorbs microwave energy, and is thereby heated, is determined by its dielectric properties, the applied microwave frequency, and the electric field distribution within the material.

Above or below a particular optimum window of frequencies, damage may occur or curing may not occur optimally. A window may vary depending on semiconductor substrate configuration, geometry, and material composition. A window may also vary depending on the nature and configuration of the polymer layer or layers. The selection of a window for a particular semiconductor substrate and polymer layer is typically obtained either empirically through trial and error, or theoretically using power reflection curves and the like.

Within a window of frequencies selected for a particular semiconductor substrate and polymer layer, it is generally desirable to select the frequencies that result in the shortest time to cure the polymer layer. Preferably, a semiconductor substrate is processed with a subset of frequencies from the upper end of each window. More modes can be excited with higher frequencies than with lower frequencies, thereby resulting in shorter cure times. Additionally, better uniformity in curing is typically achieved by using the upper-end frequencies within a window. However, any subset of frequencies within a window of frequencies may be used.

Many semiconductor substrates have multiple windows of frequencies within which polymer layers will cure without causing damage to the substrate or polymer layer. For example, a semiconductor substrate may be processed without damage between 3.50 GHz and 6.0 GHz, and may also be processed without damage between 7.0 GHz and 10.0 GHz. The availability of additional windows provides additional flexibility for achieving rapid, uniform, yet damage-free curing. Often times semiconductor sub-